United States Patent
Gou et al.

(10) Patent No.: US 8,922,403 B2
(45) Date of Patent: Dec. 30, 2014

(54) ANALOG-TO-DIGITAL CONVERSION CIRCUIT, ANALOG-TO-DIGITAL CONVERSION METHOD, AND IMAGE SENSOR

(71) Applicants: Industry-University Cooperation Foundation Hanyang University, Seoul (KR); SK hynix Inc., Gyeonggi-do (KR)

(72) Inventors: Ja-Seung Gou, Gyeonggi-do (KR); Oh-Kyong Kwon, Seoul (KR); Min-Seok Shin, Seoul (KR); Min-Kyu Kim, Seoul (KR)

(73) Assignees: SK Hynix Inc., Gyeonggi-do (KR); Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 14/051,102

(22) Filed: Oct. 10, 2013

(65) Prior Publication Data
US 2014/0292550 A1 Oct. 2, 2014

(30) Foreign Application Priority Data
Apr. 1, 2013 (KR) .................. 10-2013-0035147

(51) Int. Cl.
H03M 1/06 (2006.01)
H03M 3/00 (2006.01)

(52) U.S. Cl.
CPC .................. *H03M 3/322* (2013.01)
USPC ............ 341/118; 341/155; 341/119; 341/120

(58) Field of Classification Search
CPC ....................................................... H03M 1/12
USPC .......................................... 341/155, 117–120
See application file for complete search history.

(56) References Cited

U.S. PATENT DOCUMENTS

| 6,734,817 B2 * | 5/2004 | Naka et al. ................. 341/155 |
| 7,755,698 B2 * | 7/2010 | Galambos et al. .......... 348/372 |
| 2003/0128145 A1 * | 7/2003 | Naka et al. .............. 341/155 |
| 2010/0039306 A1 | 2/2010 | Simony et al. |

FOREIGN PATENT DOCUMENTS

KR 1020010001834 1/2001

* cited by examiner

*Primary Examiner* — Jean B Jeanglaude
(74) *Attorney, Agent, or Firm* — IP & T Group LLP

(57) ABSTRACT

An analog-to-digital conversion circuit includes an analog-to-digital conversion unit configured to analog-to-digital convert an input voltage and generate a digital signal, a resolution control unit configured to: set a resolution of the analog-to-digital conversion unit to N (N is the natural number) bits, in a case where the input voltage is smaller than a first voltage, and set the resolution of the analog-to-digital conversion unit to N−M ($1 \leq M < N$, M is the natural number) bits in a case where the input voltage is larger than the first voltage, and a signal correction unit configured to: generate a corrected digital signal based on a boundary value and the digital signal, in a case where a value of the digital signal is larger than the boundary value and the input voltage is smaller than the first voltage.

21 Claims, 6 Drawing Sheets

ANALOG-TO-DIGITAL CONVERSION CIRCUIT, ANALOG-TO-DIGITAL CONVERSION METHOD, AND IMAGE SENSOR

CROSS-REFERENCE TO RELATED APPLICATIONS

The present application claims priority of Korean Patent Application No. 10-2013-0035147, filed on Apr. 1, 2013, which is incorporated herein by reference in its entirety.

BACKGROUND

1. Field

Exemplary implementations of the present invention relate to an analog-to-digital conversion circuit, an analog-to-digital conversion method, and an image sensor, which can decrease a non-linear error of a digital signal when performing analog-to-digital conversion.

2. Description of the Related Art

Recently, the demand for digital cameras has explosively increased with the development of visual communication using the Internet. Moreover, as mobile communication terminals mounted with a camera, such as a PDA (personal digital assistant), an IMT-2000 (International Mobile Telecommunications-2000) terminal and a CDMA (code division multiple access) terminal, are popularized, the demand for small-sized camera modules has increased.

A camera module includes an image sensor. In general, an image sensor refers to a device that converts an optical image into an electrical signal. Examples of common image sensors include a CCD (charge coupled device) or a CMOS (complementary metal oxide semiconductor) image sensor.

The CCD has a complicated driving scheme and high power consumption. Furthermore, since the number of mask processes required for fabrication is relatively large, fabrication processing is complex. In addition, since a signal processing circuit cannot be realized in a chip, it is difficult to realize the CCD in one chip.

However, in the CMOS image sensor, monolithic integration of control, driving, and signal processing circuits in a single chip is possible. Accordingly, attention has recently been paid to the CMOS image sensor. Also, when compared to a CCD image sensor, the CMOS image sensor has a lower cost due to a low voltage operation, low power consumption, compatibility with peripheral devices, and the recued complexity a standard CMOS fabrication process.

The CMOS image sensor includes a plurality of unit pixels. The pixels output analog signals (hereinafter, referred to as "pixel signals") with voltage levels corresponding to light incident thereon. The CMOS image sensor generates pixel data by analog-to-digital converting these pixel signals, and the pixel data are used in storing and outputting an image. The CMOS image sensor includes an analog-to-digital conversion circuit which is used to convert an analog signal into a digital signal, for analog-to-digital conversion of a pixel signal.

In general, as a resolution increases, the power consumption and an analog-to-digital conversion time of an analog-to-digital conversion circuit increase. Meanwhile, shot noise increases as the intensity of light incident on a pixel increases. Due to this fact, as the intensity of light increases, the magnitude of quantization noise permitted in the analog-to-digital conversion circuit increases. Accordingly, in a case where the intensity of light incident on a pixel is large, data corresponding to the incident light may be generated with no problem even though a resolution of analog-to-digital conversion is relatively low, when compared to a case where the intensity of light is small. Accordingly, an analog-to-digital conversion circuit that analog-to-digital converts a pixel signal by applying different resolutions based on the intensity of light obtained by determining an approximate intensity of light incident on a pixel (the level of a pixel signal). In the case of using such an analog-to-digital conversion circuit, power consumption and an analog-to-digital conversion time may be decreased.

FIG. 1 is a configuration diagram of a related analog-to-digital conversion circuit in which different resolutions are applied according to the level of an input voltage.

Referring to FIG. 1, an analog-to-digital conversion circuit includes a comparator 110, a resolution control unit 120, and an analog-to-digital conversion unit 130.

The comparator 110 is configured to compare an input voltage VIN to a reference voltage VREF, and output a comparison result. For example, the comparator 110 may output a logic high level in the case where the input voltage VIN is larger than the reference voltage VREF, and may output a logic low level in the case where the input voltage VIN is smaller than the reference voltage VREF. When offset is not exit in the comparator 110, the reference voltage VREF should be a boundary. where the resolution of a digital signal DIG<0:N−1>, acquired by analog-to-digital converting the input voltage VIN, changes. The value of the digital signal DIG<0:N−1> should be continuous at the boundary.

The resolution control unit 120 is configured to determine, in response to the comparison result of the comparator 110, the resolution of the analog-to-digital conversion by the analog-to-digital conversion unit 130. For example, in a case where the comparator 110 determines (in the case where the output of the comparator 110 has the logic low level) that the input voltage VIN is smaller than the reference voltage VREF, the resolution control unit 120 determines the resolution of the analog-to-digital conversion unit 130 as N bits. In a case where the comparator 110 determines (in the case where the output of the comparator 110 has the logic high level) that the input voltage VIN is than the reference voltage VREF, the resolution of the analog-to-digital conversion unit 130 as N−M bits.

The analog-to-digital conversion unit 130 is configured to analog-to-digital convert the input voltage VIN based on the resolution determined by the resolution control unit 120 and generate the digital signal DIG<0:N−1>.

The comparator may be configured using an operational amplifier or the like. In general, in a semiconductor circuit, such as an operational amplifier, an offset voltage exists. The offset voltage may be caused by an error in a design, a semiconductor fabrication process, an error in a package, or the external environment. In the case where a positive offset exists, the comparator 110 outputs a logic high level if the input voltage VIN is larger than the sum of the reference voltage VREF and an offset voltage. Otherwise, the comparator 110 outputs a logic low level. In the case where a negative offset exists, the comparator 110 outputs a logic high level if the input voltage VIN is larger than the difference between the reference voltage VREF and an offset voltage. Otherwise, the comparator 110 outputs a logic low level. FIG. 2 is a graph explaining a non-linear error occurring due to an offset that exists in the comparator 110. FIG. 2 shows the digital signal DIG<0:N−1> according to the magnitude of the input voltage VIN.

L1 shows the digital signal DIG<0:N−1> based on a magnitude of the input voltage VIN, in a case where an offset does not exist in the comparator 110. L2 shows the digital signal DIG<0:N−1> based a magnitude of the input voltage VIN, in a case where a positive offset exists in the comparator 110. L3 shows the digital signal DIG<0:N−1> based on a magnitude of the input voltage VIN, in the case where a negative offset exists in the comparator 110.

In an ideal case, the slope (proportional to a resolution) of a graph should be changed at a point where the input voltage VIN becomes the same as the reference voltage VREF, as in L1, and the graph should be continuous at the point where the input voltage VIN is the reference voltage VREF. However, in the case where a positive offset exists in the comparator 110, the slope of a graph is changed at a point where the input voltage VIN is the same as the sum of the reference voltage VREF and an offset voltage VOFF, as in L2, and the graph is not continuous at that point and a non-linear error occurs. Also, in the case where a negative offset exists in the comparator 110, the slope of a graph is changed at a point where the input voltage VIN is the same as the difference between the reference voltage VREF and the offset voltage VOFF, as in L3, and the graph is not continuous at that point and a non-linear error occurs. Such non-linear errors exert negative influences on the precision of an analog-to-digital convertor.

SUMMARY

Various exemplary implementations are directed to an analog-to-digital conversion circuit, an analog-to-digital conversion method, and an image sensor, which can decrease a non-linear error occurring at a boundary where a resolution changes, in the case of changing the resolution of analog-to-digital conversion according to the level of an input voltage.

An exemplary analog-to-digital conversion circuit may include an analog-to-digital conversion unit configured to analog-to-digital convert an input voltage and generate a digital signal; a resolution control unit configured to: set a resolution of the analog-to-digital conversion unit to N (N is the natural number) bits, in a case where the input voltage is smaller than a first voltage, and set the resolution of the analog-to-digital conversion unit to N−M (1≤M<N, M is the natural number) bits in a case where the input voltage is larger than the first voltage; and a signal correction unit configured to: generate a corrected digital signal based on a boundary value and the digital signal, in a case where a value of the digital signal is larger than the boundary value and the input voltage is smaller than the first voltage.

An exemplary analog-to-digital conversion circuit may include an analog-to-digital conversion unit configured to analog-to-digital convert an input voltage and generate a digital signal; a resolution control unit configured to: set a resolution of the analog-to-digital conversion unit to N bits, in the case where the input voltage is smaller than a first voltage, and set the resolution of the analog-to-digital conversion unit to N+M bits, in the case where the input voltage is larger than the first voltage; and a signal correction unit configured to: generate a corrected digital signal based on a boundary value and the digital signal, in the case where the input voltage is larger than the first voltage or a value of the digital signal is smaller than the boundary value.

An exemplary analog-to-digital conversion circuit may include an analog-to-digital conversion unit configured to analog-to-digital convert an input voltage and generate a digital signal; a resolution control unit configured to: set a resolution of the analog-to-digital conversion unit to N (N is the natural number) bits, in a case where the input voltage is smaller than a first voltage, set a resolution of the analog-to-digital conversion unit to N−K1 (1≤K1<N, K1 is the natural number) bits, in a case where the input voltage is larger than the first voltage and is smaller than a second voltage larger than the first voltage, and set a resolution of the analog-to-digital conversion unit to N−K1−K2 (1≤K2<N−K2, K2 is the natural number) bits, in a case where the input voltage is larger than the second voltage; and a signal correction unit configured to: generate a corrected digital signal based on a first boundary value and the digital signal, in the case where a value of the digital signal is larger than the first boundary value and the input voltage is smaller than the first voltage, and generate a corrected digital signal based on a second boundary value and the digital signal, in a case where the value of the digital signal is larger than the second boundary value larger than the first boundary value and the input voltage is smaller than the second voltage.

An exemplary analog-to-digital conversion method may include comparing a voltage level of an input voltage and a voltage level of a first voltage; analog-to-digital converting the input voltage using a resolution of N (N is the natural number) bits and generating a digital signal, in the case where the input voltage is smaller than the first voltage, or analog-to-digital converting the input voltage, using a resolution of N−M (1≤M<N, M is the natural number) bits and generating a digital signal, in the case where the input voltage is larger than the first voltage; and generating a corrected digital signal based on a boundary value and the digital signal, in the case where a value of the digital signal is larger than the boundary value and the input voltage is smaller than the first voltage.

An exemplary image sensor may include a pixel unit configured to output a pixel signal having a voltage level; a pixel signal sampling unit configured to sample the pixel signal and output a sampling voltage; an analog-to-digital conversion unit configured to: receive the sampling voltage, analog-to-digital convert the sampling voltage, and generate a digital signal based on the sampling voltage; a resolution control unit configured to: set a resolution of the analog-to-digital conversion unit to N bits, in the case where the sampling voltage is smaller than a first voltage, or set a resolution of the analog-to-digital conversion unit to N−M (1≤M<N) bits, in the case where the sampling voltage is larger than the first voltage; and a signal correction unit configured to generate a corrected digital signal based on a boundary value and the digital signal, in the case where a value of the digital signal is larger than the boundary value and the sampling voltage is smaller than the first voltage.

DETAILED DESCRIPTION

Figure 1:
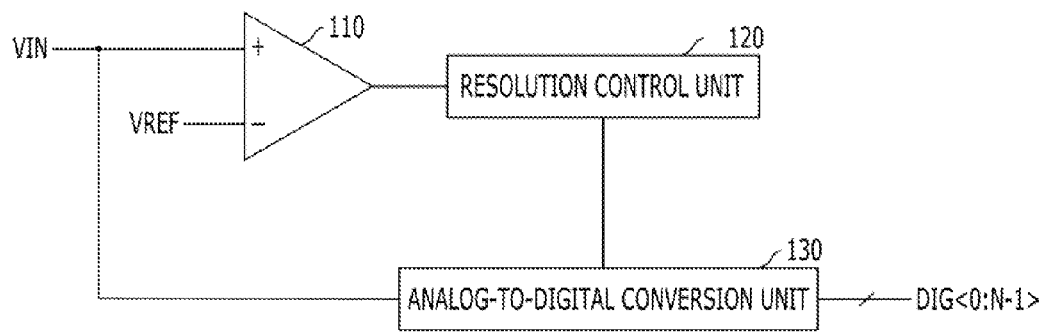
FIG. 1 shows a related analog-to-digital conversion circuit, in which different resolutions are applied according to the level of an input voltage.
Figure 2:
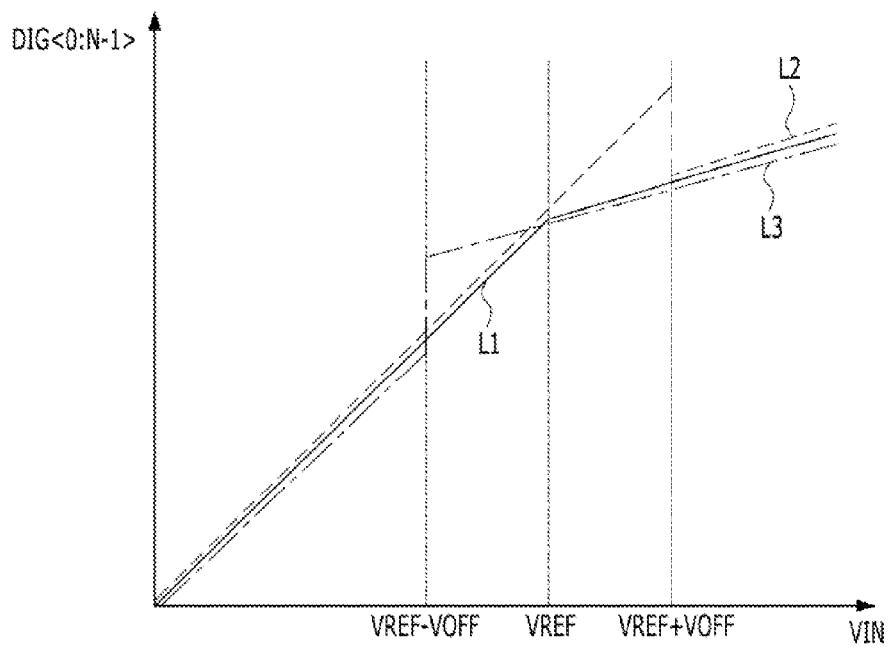
FIG. 2 is a diagram explaining a non-linear error occurring due to an offset that exists in a comparator of a related analog-to-digital conversion circuit.

Various exemplary implementations will be described below in more detail with reference to the accompanying drawings. The present invention may, however, be embodied in different forms and should not be construed as limited to the exemplary implementations set forth herein. Rather, these exemplary implementations are provided so that this disclosure will be thorough and complete, and will fully convey the scope of the present invention to those skilled in the art. Throughout the disclosure, like reference numerals refer to like parts throughout the various figures and exemplary implementations of the present invention.

Figure 3:
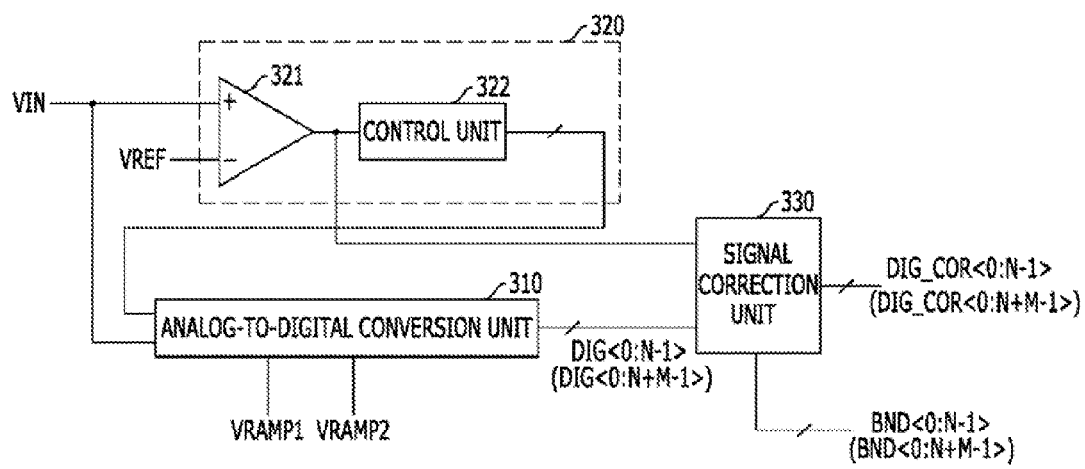
FIG. 3 shows an exemplary analog-to-digital conversion circuit.

FIG. 3 is a configuration diagram of an exemplary analog-to-digital conversion circuit.

Referring to FIG. 3, an exemplary analog-to-digital conversion circuit includes an analog-to-digital conversion unit 310 that analog-to-digital converts an input voltage VIN and generates a digital signal DIG<0:N−1>. The exemplary analog-to-digital conversion circuit includes resolution control unit 320 controls the resolution of the analog-to-digital conversion unit 310 to N bits in the case where the input voltage VIN is smaller than a first voltage and controls the resolution of the analog-to-digital conversion unit 310 to N−M ($1 \leq M < N$) bits in the case where the input voltage VIN is larger than the first voltage. The exemplary analog-to-digital conversion circuit further includes a signal correction unit 330 that generates a corrected digital signal DIG_COR<0:N−1>, in a case where a value of the digital signal DIG<0:N−1> is larger than the boundary value BND<0:N−1> and the input voltage VIN is smaller than the first voltage The input voltage VIN is an analog signal that has a predetermined voltage level. The digital signal DIG<0:N−1> is an N-bit digital signal that is generated by analog-to-digital converting the input voltage VIN, and the corrected digital signal DIG_COR<0:N−1> is an N-bit digital signal corresponding to the corrected input voltage VIN. The boundary value BND<0:N−1> is a digital value which corresponds to voltage level of a reference voltage VREF.

The analog-to-digital conversion unit 310 converts the input voltage VIN based on a predetermined resolution and generates the digital signal DIG<0:N−1>. The resolution of the analog-to-digital conversion unit 310, of FIG. 3, may be N bits or N−M bits. There are several methods in which the analog-to-digital conversion unit 310 converts the input voltage VIN into the digital signal DIG<0:N−1> based on the predetermined resolution. In a case where the predetermined resolution is N bits, the analog-to-digital conversion unit 310 may generate the digital signal DIG<0:N−1> using a first ramp signal VRAMP1, having a first slope, and the input voltage VIN. In a case where the predetermined resolution is N−M bits, the analog-to-digital conversion unit 310 may generate the digital signal DIG<0:N−1> using a second ramp signal VRAMP2, having a second slope that is $2^M$ times the first slope, and the input voltage VIN. An operation of the analog-to-digital conversion unit 310 will be described below with reference to FIG. 4.

Figure 4:
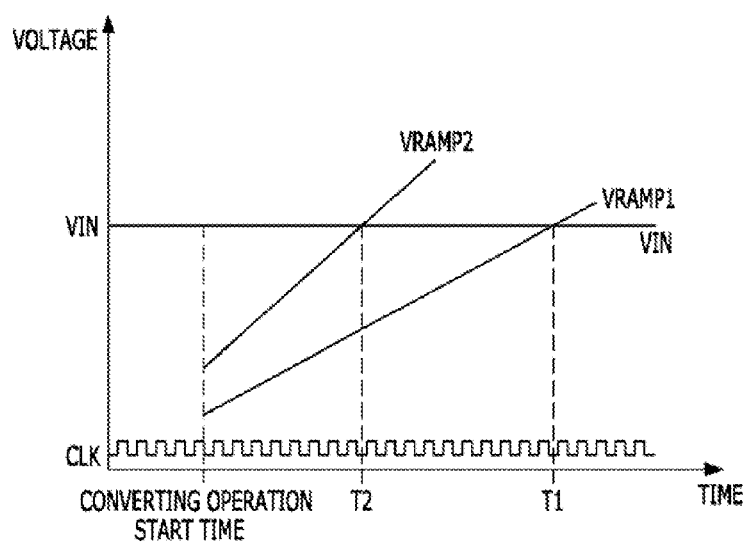
FIG. 4 is a waveform diagram explaining an operation of an exemplary analog-to-digital conversion unit.

FIG. 4 is a waveform diagram explaining an operation of the analog-to-digital conversion unit 310. In the case where the resolution of the analog-to-digital conversion unit 310 is N bits, a counter (not shown) included in the analog-to-digital conversion unit 310 counts a clock signal CLK from a converting operation start time to a time T1, at which the magnitudes of the input voltage VIN and the first ramp signal VRAMP1 become equal. In the case where the resolution of the analog-to-digital conversion unit 310 is N−M bits, the counter counts the clock signal CLK from the converting operation start time to a time T2, at which the magnitudes of the input voltage VIN and the second ramp signal VRAMP2 become equal. In the case where the resolution is N bits, the analog-to-digital conversion unit 310 starts counting from an initial value (for example, All bits of digital signal<0:N−1> is '0'), and in the case where the resolution is N−M bits, the analog-to-digital conversion unit 310 starts counting from the boundary value BND<0:N−1>. A counting result corresponds to the digital signal DIG<0:N−1>.

In the case where the input voltage VIN is smaller than the first voltage, the resolution control unit 320 determines the resolution of the analog-to-digital conversion unit 310 to N bits. In the case where the resolution of the analog-to-digital conversion unit 310 is N bits, the resolution control unit 320 may cause the analog-to-digital conversion unit 310 to analog-to-digital convert the input voltage VIN using the first ramp signal VRAMP1. Further, in the case where the input voltage VIN is larger than the first voltage, the resolution control unit 320 determines the resolution of the analog-to-digital conversion unit 310 to N−M bits. In the case where the resolution of the analog-to-digital conversion unit 310 is N−M bits, the resolution control unit 320 may cause the analog-to-digital conversion unit 310 to analog-to-digital convert the input voltage VIN using the second ramp signal VRAMP2.

The resolution control unit 320 may include a comparing section 321 and a control unit 322. The comparing section 321 is inputted with the input voltage VIN and the reference voltage VREF to discriminate whether the input voltage VIN is larger or smaller than the first voltage. The comparing section 321 may be a comparator that compares the levels of voltages inputted through two input terminals. In the case where the aforementioned offset does not exist in the comparing section 321, the voltage level of the first voltage may be the same as the reference voltage VREF. In the case where a positive offset exists in the comparing section 321, the voltage level of the first voltage may be higher than the reference voltage VREF. Moreover, in the case where a negative offset exists in the comparing section 321, the voltage level of the first voltage may be lower than the reference voltage VREF. In the case where the input voltage VIN is determined to be smaller than the first voltage by the comparing section 321, the control unit 322 controls the resolution of the analog-to-digital conversion unit 310 to N bits. In the case where the comparing section 321 determines that the input voltage VIN is larger than the first voltage, the control unit 322 controls the resolution of the analog-to-digital conversion unit 310 to N−M bits.

For reference, the voltage level of the reference voltage VREF should be larger than the sum of a boundary voltage and the value of the offset existing between VREF and VIN at the comparing section 321. The boundary voltage represents the voltage level of the input voltage VIN at a point where a resolution is changed in the corrected digital signal DIG_COR<0:N−1>. The boundary value BND<0:N−1> corresponds to a value acquired by analog-to-digital converting the boundary voltage. [What is the boundary value? What does it mean?] The boundary voltage and the boundary value BND<0:N−1> may be changed according to a design. The first voltage is higher than the boundary voltage.

In a case where the value of the digital signal DIG<0:N−1> is larger than the boundary value BND<0:N−1> and the input voltage VIN is smaller than the first voltage, the signal correction unit 330 generates the corrected digital signal DIG_COR<0:N−1> based on Equation 1, using the boundary value BND<0:N−1> and the digital signal DIG<0:N−1>.

$$\text{Corrected digital signal}(DIGCOR\langle 0:N-1\rangle) = \qquad \text{[Equation 1]}$$
$$\text{boundary value}(BND\langle 0:N-1\rangle) +$$
$$\frac{1}{2^M}(\text{digita signal}(DIG\langle 0:N-1\rangle) -$$
$$\text{boundary value}(BND\langle 0:N-1\rangle))$$

In a case where the value of the digital signal DIG<0:N−1> is smaller than the boundary value BND<0:N−1> or the input voltage VIN is larger than the first voltage, the signal correction unit 330 transfers the digital signal DIG<0:N−1> as the corrected digital signal DIG_COR<0:N−1>.

That is, in the case where the input voltage VIN is smaller than the boundary value (the digital signal is smaller than the boundary value) or is larger than the first voltage, the signal correction unit 330 transfers the digital signal DIG<0:N−1> as the corrected digital signal DIG_COR<0:N−1>. In the case where the input voltage VIN is larger than the boundary voltage (a digital signal is larger than the boundary value) and is smaller than the first voltage, the signal correction unit 330 generates the corrected digital signal DIG_COR<0:N−1> based on Equation 1, using the digital signal DIG<0:N−1> and the boundary value BND<0:N−1>.

Figure 5:
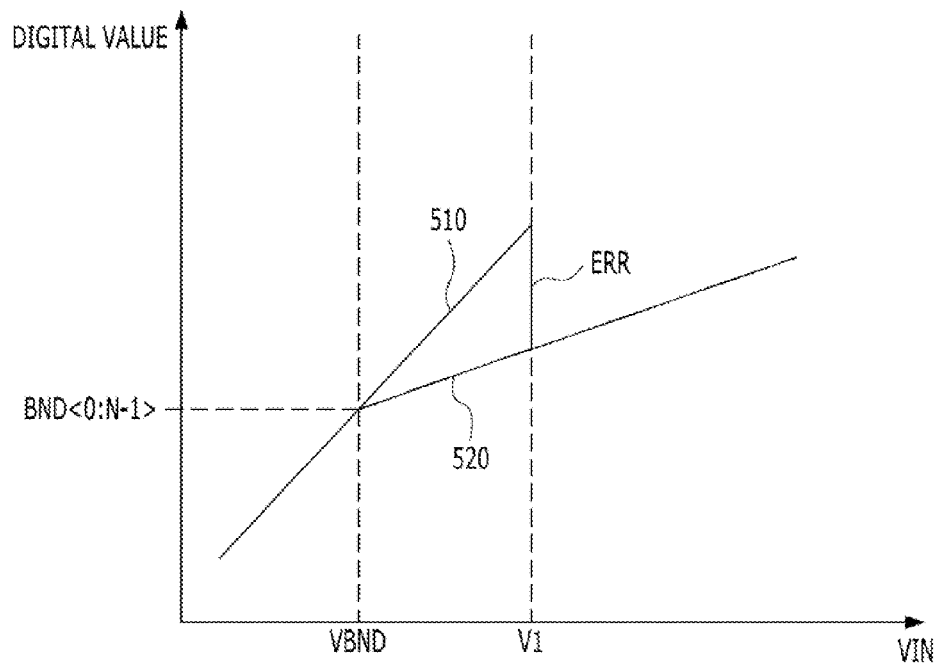
FIG. 5 is a graph explaining an effect of an exemplary analog-to-digital conversion circuit.

FIG. 5 is a graph explaining the effect of the exemplary analog-to-digital conversion circuit. FIG. 5 shows changes to the digital signal DIG<0:N−1> and the corrected digital signal DIG_COR<0:N−1> based on the input voltage VIN.

A first line 510 represents a relationship between the input voltage VIN and the digital signal DIG<0:N−1>. A second line 520 represents a relationship between the input voltage VIN and the corrected digital signal DIG_COR<0:N−1>.

As can be seen from the first line 510, a resolution (the slope of the line 510) of the digital signal DIG<0:N−1>, before being corrected, suffers a non-linear error when the voltage level of the input voltage VIN equals a first voltage V1. In contrast, as can be seen from the second line 520, a resolution (the slope of the graph 520) of the corrected digital signal DIG_COR<0:N−1>, generated by the exemplary analog-to-digital conversion circuit, changes at a point where the voltage level of the input voltage VIN becomes a boundary voltage VBND. Therefore, a non-linear error does not occur, and the line retains continuity at the point where the resolution of the analog-to-digital conversion circuit changes (a point where the input voltage VIN is the same as the boundary voltage VBND).

An analog-to-digital conversion circuit in accordance with a variation of the implementation will be described below with reference back to FIG. 3.

Referring to FIG. 3, an alternative implementation of the exemplary analog-to-digital conversion circuit includes an analog-to-digital conversion unit 310 that analog-to-digital converts an input voltage VIN and generates a digital signal DIG<0:N+M−1>. The exemplary analog-to-digital conversion circuit includes a resolution control unit 320 that determines, in the case where the input voltage VIN is smaller than a first voltage, the resolution of the analog-to-digital conversion unit 310 to N bits, and determines, in the case where the input voltage VIN is larger than the first voltage, the resolution of the analog-to-digital conversion unit 310 to N+M bits. The analog-to-digital conversion circuit further includes a signal correction unit 330 that generates a corrected digital signal DIG_COR<0:N+M−1>, in the case where the digital signal DIG<0:N+M−1> being larger than a boundary value BND<0:N+M−1> and the input voltage VIN is smaller than the first voltage, and outputs the digital signal DIG<0:N+M−1>, in the case where the input voltage VIN is larger than the first voltage and the value of the digital signal DIG<0:N+M−1> is smaller than the boundary value BND<0:N+M−1>.

The alternative implementation of the exemplary analog-to-digital conversion circuit will be described with reference to FIG. 3.

The exemplary analog-to-digital conversion unit 310 analog-to-digital converts the input voltage VIN according to a predetermined resolution and generates the digital signal DIG<0:N+M−1>. The resolution of the analog-to-digital conversion unit 310, of FIG. 3, may be N bits or N+M bits. There are several methods in which the analog-to-digital conversion unit 310 converts the input voltage VIN into the digital signal DIG<0:N+M−1> based on the predetermined resolution. In the case where the predetermined resolution is N bits, the analog-to-digital conversion unit 310 may generate the digital signal DIG<0:N+M−1> using a first ramp signal VRAMP1, having a first slope, and the input voltage VIN. In a case where the predetermined resolution is N−M bits, the analog-to-digital conversion unit 310 may generate the digital signal DIG<0:N+M−1> using a second ramp signal VRAMP2, having a second slope that is $\frac{1}{2}^M$ times the first slope, and the input voltage VIN.

Operations of the analog-to-digital conversion unit 310 are substantially the same as described above with reference to FIG. 4.

In the case where the input voltage VIN is smaller than the first voltage, the resolution control unit 320 determines the resolution of the analog-to-digital conversion unit 310 to N bits. In the case where the resolution of the analog-to-digital conversion unit 310 is N bits, the resolution control unit 320 may cause the analog-to-digital conversion unit 310 to convert the input voltage VIN using the first ramp signal VRAMP1. Further, in the case where the input voltage VIN is larger than the first voltage, the resolution control unit 320 determines the resolution of the analog-to-digital conversion unit 310 to N+M bits. In the case where the resolution of the analog-to-digital conversion unit 310 is N+M bits, the resolution control unit 320 may cause the analog-to-digital conversion unit 310 to convert the input voltage VIN using the second ramp signal VRAMP2.

For these operations, the resolution control unit 320 may include a comparing section 321 and a control unit 322. The operations of the resolution control unit 320 are similar to those described above with reference to FIG. 3. However, in the case where the comparing section 321 determines that the input voltage VIN is smaller than the first voltage, the control unit 322 controls the resolution of the analog-to-digital conversion unit 310 to N bits. In the case where the comparing section 321 determines that the input voltage VIN is larger than the first voltage, the control unit 322 controls the resolution of the analog-to-digital conversion unit 310 to N+M bits.

In the case where the value of the digital signal DIG<0:N+M−1> is larger than the boundary value BND<0:N+M−1> and the input voltage VIN is smaller than the first voltage, the signal correction unit 330 generates the corrected digital signal DIG_COR<0:N+M−1> based on Equation 2, using the boundary value BND<0:N+M−1> and the digital signal DIG<0:N+M−1>.

$$\text{Corrected digital signal}(DIGCOR\langle 0{:}N+M-1\rangle) = \quad \text{[Equation 2]}$$
$$\text{boundary value}(BND\langle 0{:}N+M-1\rangle) -$$
$$\frac{1}{2^M}(\text{boundary value}(BND\langle 0{:}N+M-1\rangle) -$$
$$\text{digita signal}(DIG\langle 0{:}N+M-1\rangle))$$

In the case where the value of the digital signal DIG<0:N+M−1> is smaller than the boundary value BND<0:N+M−1> or the input voltage VIN is larger than the first voltage, the signal correction unit 330 transfers the digital signal DIG<0:N+M−1> as the corrected digital signal DIG_COR<0:N+M−1>.

That is, in the case where the input voltage VIN is smaller than the boundary value (a digital signal is smaller than the boundary value) or is larger than the first voltage, the signal correction unit 330 transfers the digital signal DIG<0:N+M−1> as the corrected digital signal DIG_COR<0:N+M−1>. In the case where the input voltage VIN is larger than the boundary voltage (a digital signal is larger than the boundary value) and is smaller than the first voltage the signal correction unit 330 generates the corrected digital signal DIG_COR<0:N+M−1> based on Equation 2, using the digital signal DIG<0:N+M−1> and the boundary value BND<0:N+M−1.

Figure 6:
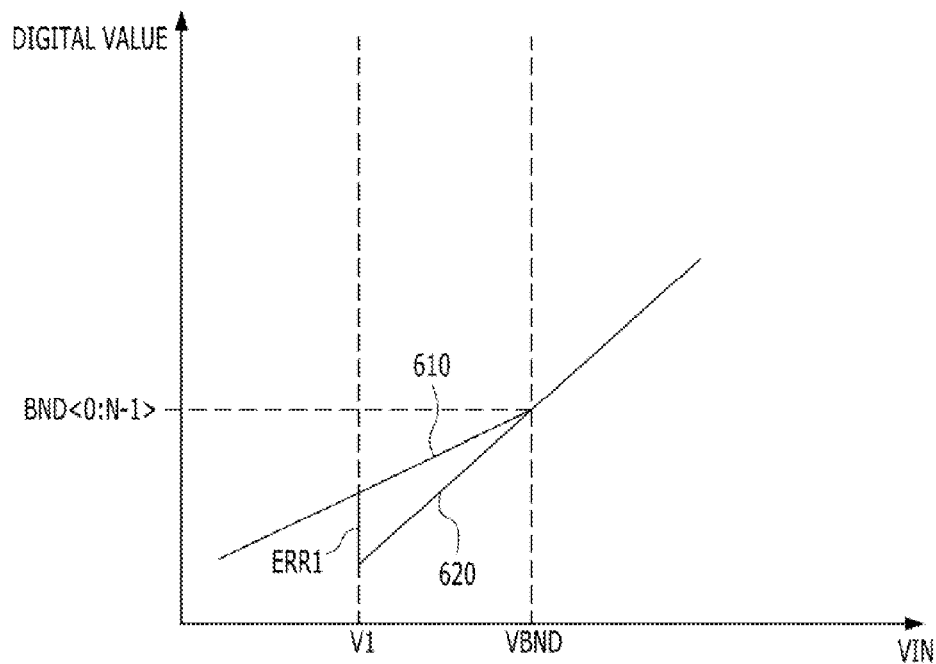
FIG. 6 is a graph explaining an effect of an exemplary analog-to-digital conversion circuit.

FIG. 6 is a graph explaining the effect of the alternative implementation of the exemplary analog-to-digital conversion. FIG. 6 shows changes to the digital signal DIG<0:N+M−1> and the corrected digital signal DIG_COR<0:N+M−1> based on the input voltage VIN.

A first line 610 represents a relationship between the input voltage VIN and the digital signal DIG<0:N+M−1>. A second graph 620 represents a relationship between the input voltage VIN and the corrected digital signal DIG_COR<0:N+M−1>.

As can be readily seen from FIG. 6, a non-linear error ERR occurs in the digital signal DIG<0:N+M−1>, before being corrected, at a point where the input voltage VIN is the same as a first voltage V1. In contrast, in the resolution of the corrected digital signal DIG_COR<0:N+M−1>, generated by the exemplary analog-to-digital conversion unit 310, changes at a point where the input voltage VIN is the same as a boundary voltage VBND. Thus, a non-linear error does not occur.

Figure 7:
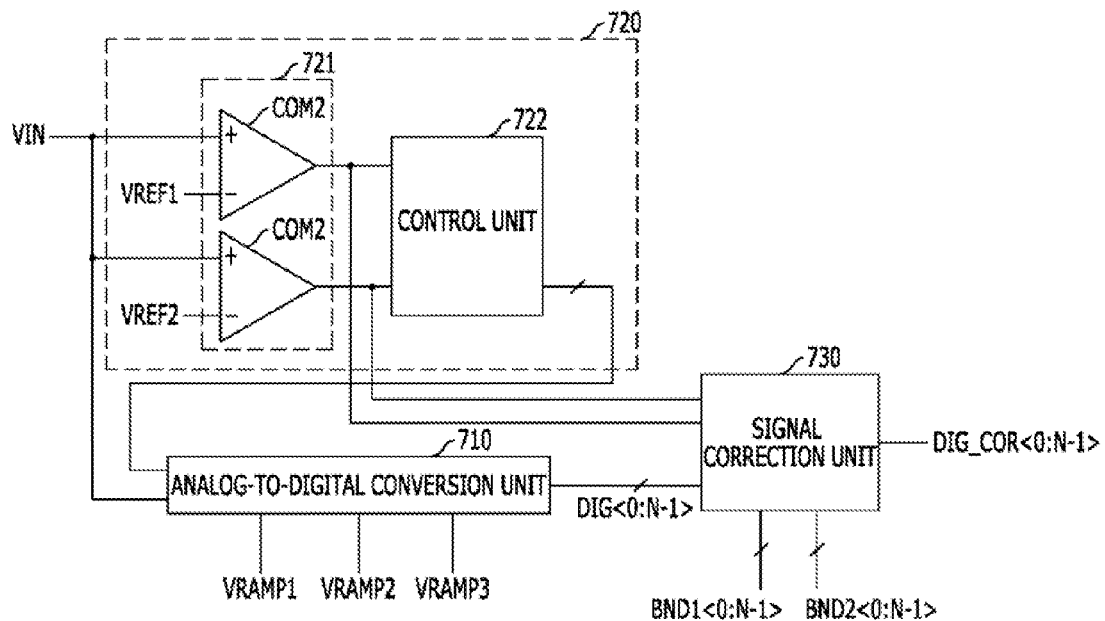
FIG. 7 is a configuration diagram of an exemplary analog-to-digital conversion circuit.

FIG. 7 is a configuration diagram of an exemplary analog-to-digital conversion circuit.

Referring to FIG. 7, an exemplary analog-to-digital conversion circuit includes an analog-to-digital conversion unit 710 that analog-to-digital convert an input voltage VIN and generates a digital signal DIG<0:N−1>. The exemplary analog-to-digital conversion circuit includes a resolution control unit 720 that controls the resolution of the analog-to-digital conversion unit 710 to N bits in the case where the input voltage VIN is smaller than a first voltage, controls the resolution of the analog-to-digital conversion unit 710 to N−K1 (1≤K1<N) bits, in the case where the input voltage VIN is larger than the first voltage and smaller than a second voltage larger than the first voltage, and controls the resolution of the analog-to-digital conversion unit 710 to N−K1−K2 (1≤K2<N−K2) bits, in the case where the input voltage VIN is larger than the second voltage. The exemplary analog-to-digital conversion circuit further includes a signal correction unit 730 that generates a corrected digital signal DIG_COR<0:N−1> in response to a first boundary value BND1<0:N−1> and the digital signal DIG<0:N−1>, in the case where the value of the digital signal DIG<0:N−1> is larger than the first boundary value BND1<0:N−1> and the input voltage VIN is smaller than the first voltage, and generates a corrected digital signal DIG_COR<0:N−1> in response to a second boundary value BND2<0:N−1> and the digital signal DIG<0:N−1>, in the case where the value of the digital signal DIG<0:N−1> is larger than the second boundary value BND2<0:N−1> larger than the first boundary value BND1<0:N−1> and the input voltage VIN is smaller than the second voltage.

The exemplary analog-to-digital conversion circuit will be described with reference to FIG. 7.

The input voltage VIN is an analog signal that has a predetermined voltage level. The digital signal DIG<0:N−1> is an N-bit digital signal that is generated by analog-to-digital converting the input voltage VIN. The corrected digital signal DIG_COR<0:N−1> is an N-bit digital signal that corresponds to the completely corrected input voltage VIN.

The analog-to-digital conversion unit 710 analog-to-digital the input voltage VIN based on a predetermined resolution and generates the digital signal DIG<0:N−1>. The resolution of the analog-to-digital conversion unit 710 of N bits, N−K1 bits, or N−K1−K2 bits. There are several methods in which the analog-to-digital conversion unit 710 converts the input voltage VIN into the digital signal DIG<0:N−1> based on to the predetermined resolution. In the case where the predetermined resolution is N bits, the analog-to-digital conversion unit 710 may generate the digital signal DIG<0:N−1> using a first ramp signal VRAMP1, having a first slope and the input voltage VIN. In the case where the predetermined resolution is N−K1 bits, the analog-to-digital conversion unit 710 may generate the digital signal DIG<0:N−1> using a second ramp signal VRAMP2, having a second slope that is $2^{K1}$ times the first slope, and the input voltage VIN. In the case where the predetermined resolution is N−K1−K2 bits, the analog-to-digital conversion unit 710 may generate the digital signal DIG<0:N−1> using a third ramp signal VRAMP3, having a third slope that is $2^{K2}$ times the second slope and the input voltage VIN. An operation of the analog-to-digital conversion unit 710 will be described with reference to FIG. 8.

Figure 8:
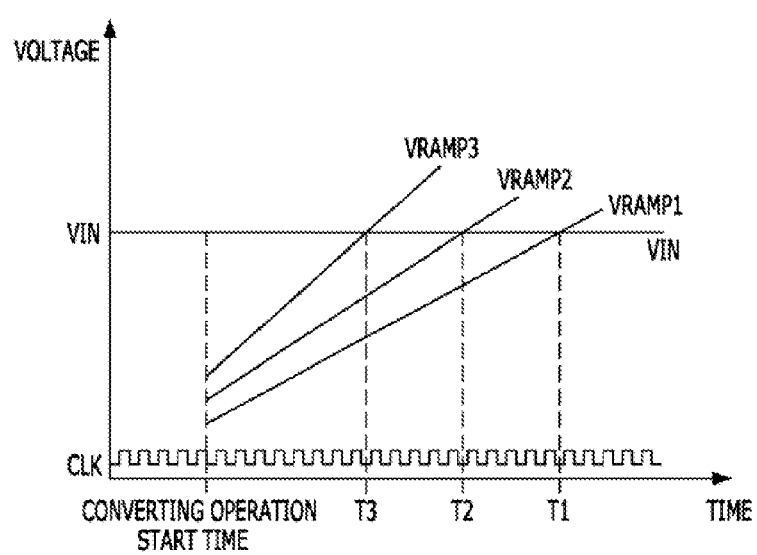
FIG. 8 is a waveform diagram explaining an operation of an exemplary analog-to-digital conversion unit.

FIG. 8 is a waveform diagram explaining an operation of the analog-to-digital conversion unit 710. In the case where the resolution of the analog-to-digital conversion unit 710 is N bits, a counter (not shown) included in the analog-to-digital conversion unit 710 counts a clock signal CLK from a converting operation start time to a time T1 at which the magnitudes of the input voltage VIN and the first ramp signal VRAMP1 become equal. In the case where the resolution of the analog-to-digital conversion unit 710 is N−K1 bits, the counter counts the clock signal CLK from the converting operation start time to a time T2, at which the magnitudes of the input voltage VIN and the second ramp signal VRAMP2 become equal. In the case where the resolution of the analog-to-digital conversion unit 710 is N−K1−K2 bits, the counter counts the clock signal CLK from the converting operation start time to a time T3, at which the magnitudes of the input voltage VIN and the third ramp signal VRAMP3 become equal. In the case where the resolution is N bits, the analog-to-digital conversion unit 710 starts counting from an initial value. In the case where the resolution is N−K1 bits, the analog-to-digital conversion unit 710 starts counting from the first boundary value BND1<0:N−1>. In the case where the resolution is N−K1−K2 bits, the analog-to-digital conversion unit 710 starts counting from the second boundary value BND2<0:N−1>. A counting result corresponds to the digital signal DIG<0:N−1>. The first boundary value BND1<0:N−1> is a digital value which corresponds to voltage level of a first reference voltage VREF1. The second boundary value BND2<0:N−1> is a digital value which corresponds to voltage level of a second reference voltage VREF1.

In the case where the input voltage VIN is smaller than the first voltage, the resolution control unit 720 determines the resolution of the analog-to-digital conversion unit 710 to N bits. In the case where the resolution of the analog-to-digital conversion unit 710 is N bits, the resolution control unit 720 may cause the analog-to-digital conversion unit 710 to convert the input voltage VIN using the first ramp signal VRAMP1. In the case where the input voltage VIN is larger than the first voltage and smaller than the second voltage, the resolution control unit 720 determines the resolution of the analog-to-digital conversion unit 710 to N−K1 bits. In the case where the resolution of the analog-to-digital conversion unit 710 is N−K1 bits, the resolution control unit 720 may cause the analog-to-digital conversion unit 710 to convert the input voltage VIN using the second ramp signal VRAMP2. In the case where the input voltage VIN is larger than the second voltage, the resolution control unit 720 determines the resolution of the analog-to-digital conversion unit 710 to N−K1−K2 bits. In the case where the resolution of the analog-to-digital conversion unit 710 is N−K1−K2 bits, the resolution control unit 720 may cause the analog-to-digital conversion unit 710 to convert the input voltage VIN using the third ramp signal VRAMP3.

The resolution control unit 720 may include a comparing section 721 and a control unit 722. The comparing section 721 is inputted with a first reference voltage VREF1 and a second reference voltage VREF2 to compare the magnitudes of the input voltage VIN, the first voltage and the second voltage. The comparing section 721 may include a comparator COM1 that is inputted with the input voltage VIN and the first reference voltage VREF1 and compares the voltage levels thereof and a comparator COM2 that is inputted with the input voltage VIN and the second reference voltage VREF2 and compares the voltage levels thereof. In the case where the offset does not exist in the two comparators, the voltage level of the first voltage may be the same as the first reference voltage VREF1 and the voltage level of the second voltage may be the same as the second reference voltage VREF2. In the case where positive offsets exist in the comparators COM1 and COM2, the voltage level of the first voltage may be higher than the first reference voltage VREF1 and the voltage level of the second voltage may be higher than the second reference voltage VREF2. Moreover, in the case where negative offsets exist in the comparators COM1 and COM2, the voltage level of the first voltage may be lower than the first reference voltage VREF1 and the voltage level of the second voltage may be lower than the second reference voltage VREF2.

In the case where the comparing section 721 determines that the input voltage VIN is smaller than the first voltage, the control unit 722 controls the resolution of the analog-to-digital conversion unit 710 to N bits. In the case where the comparing section 721 determines that the input voltage VIN is larger than the first voltage and smaller than the second voltage, the control unit 722 controls the resolution of the analog-to-digital conversion unit 710 to N−K1 bits. In the case where the comparing section 721 determines that the input voltage VIN is larger than the second voltage, the control unit 722 controls the resolution of the analog-to-digital conversion unit 710 to N−K1−K2 bits.

For reference, the voltage level of the first reference voltage VREF1 should be larger than the sum of a first boundary voltage and the magnitude of the offset existing in the comparator COM1, and the voltage level of the second reference voltage VREF2 should be larger than the sum of a second boundary voltage and the magnitude of the offset existing in the comparator COM2. The first boundary voltage represents the voltage level of the input voltage VIN at a point where a resolution is changed from N bits to N−K1 bits in the corrected digital signal DIG_COR<0:N−1>, and the second boundary voltage represents the voltage level of the input voltage VIN at a point where a resolution is changed from N−K1 bits to N−K1−K2 bits in the corrected digital signal DIG_COR<0:N−1>. The first boundary value BND1<0:N−1> corresponds to a value acquired by analog-to-digital converting the first boundary voltage, and the second boundary value BND2<0:N−1> corresponds to a value acquired by analog-to-digital converting the second boundary voltage. The first and second boundary voltages and the first and second boundary values BND1<0:N−1> and BND2<0:N−1> may be changed according to a design. The first voltage is higher than the first boundary voltage and the second voltage is higher than the second boundary voltage.

In the case where the value of the digital signal DIG<0:N−1> is larger than the first boundary value BND1<0:N−1> and the input voltage VIN is smaller than the first voltage, the signal correction unit 730 generates the corrected digital signal DIG_COR<0:N−1> based on following Equation 3, using the first boundary value BND1<0:N−1> and the digital signal DIG<0:N−1>.

In the case where the value of the digital signal DIG<0:N−1> is larger than the second boundary value BND2<0:N−1> and the input voltage VIN is smaller than the second voltage, the signal correction unit 730 generates the corrected digital signal DIG_COR<0:N−1> based on Equation 4, using the second boundary value BND2<0:N−1> and the digital signal DIG<0:N−1>.

$$\text{Corrected digital signal}(DIGCOR\langle 0:N-1\rangle) = \text{first boundary value}(BND1\langle 0:N-1\rangle) + \frac{1}{2^{K1}}(\text{digital signal}(DIG\langle 0:N-1\rangle) - \text{first boundary value}(BND1\langle 0:N-1\rangle)) \quad \text{[Equation 3]}$$

$$\text{Corrected digital signal}(DIGCOR\langle 0:N-1\rangle) = \text{second boundary value}(BND2\langle 0:N-1\rangle) + \frac{1}{2^{K2}}(\text{digital signal}(DIG\langle 0:N-1\rangle) - \text{second boundary value}(BND2\langle 0:N-1\rangle)) \quad \text{[Equation 4]}$$

In the case where the value of the digital signal DIG<0:N−1> is smaller than the first boundary value BND1<0:N−1>, in the case where the input voltage VIN is larger than the first voltage and the value of the digital signal DIG<0:N−1> is smaller than the second boundary value BND2<0:N−1>, or in the case where the input voltage VIN is larger than the second voltage, the signal correction unit 730 transfers the digital signal DIG<0:N−1> as the corrected digital signal DIG_COR<0:N−1>.

That is, the signal correction unit 730 generates the corrected digital signal DIG_COR<0:N−1> by transferring the digital signal DIG<0:N−1> as the corrected digital signal DIG_COR<0:N−1>, in the case where the input voltage VIN is smaller than the first boundary voltage, in the case where the input voltage VIN is larger than the first voltage and smaller than the second boundary voltage or in the case where the input voltage VIN is larger than the second voltage.

In the case where the input voltage VIN is larger than the first boundary voltage and is smaller than the first voltage, the signal correction unit 730 generates the corrected digital signal DIG_COR<0:N−1> based to the above-described Equation 3, using the digital signal DIG<0:N−1> and the first boundary value BND1<0:N−1>.

In the case where the input voltage VIN is larger than the second boundary voltage and is smaller than the second voltage The signal correction unit 730 generates the corrected digital signal DIG_COR<0:N−1> according to the above-described Equation 4 by using the digital signal DIG<0:N−1> and the second boundary value BND2<0:N−1>.

Figure 9:
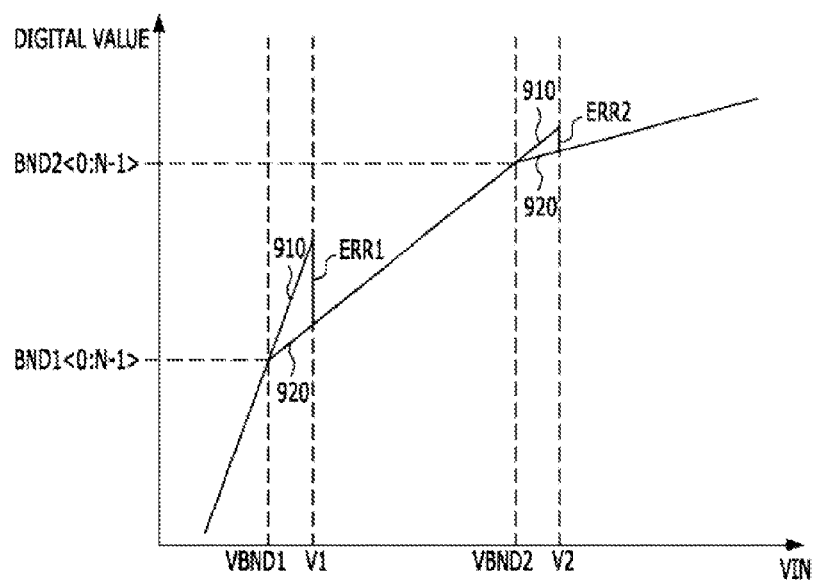
FIG. 9 is a graph explaining an effect of an exemplary analog-to-digital conversion circuit.

FIG. 9 is a graph explaining the effect of the exemplary analog-to-digital conversion circuit. FIG. 9 shows changes to the digital signal DIG<0:N−1> and the corrected digital signal DIG_COR<0:N−1> based on the input voltage VIN.

A first line 910 represents a relationship between the input voltage VIN and the digital signal DIG<0:N−1>. A second line 920 represents the relationship between the input voltage VIN and the corrected digital signal DIG_COR<0:N−1>.

As can be seen from the first line graph 910, a resolution (the slope of the line 910) of the digital signal DIG<0:N−1>, before being corrected, suffers a non-linear error when the voltage level of the input voltage VIN equals a first voltage V1 or a second voltage V2. In contrast, as can be seen from the second line 920, a resolution (the slope of the line 920) of the corrected digital signal DIG_COR<00:N−1>, which is generated by the exemplary analog-to-digital conversion circuit, is changed at points where the voltage level of the input voltage VIN becomes a first boundary voltage VBND1 or a second boundary voltage VBND2. Therefore, a non-linear error does not occur, and the line retains continuity at the point where the resolution of the analog-to-digital conversion circuit is changed.

While FIG. 9 shows that the resolution of the analog-to-digital conversion unit 710 is decreased as the voltage level of the input voltage VIN increases, in an alternative implementation the resolution of the analog-to-digital conversion unit 710 may be increased as the voltage level of the input voltage VIN increases. In this case, the signal correction unit 930 may generate the corrected digital signal DIG_COR<0:N−1> according to the above-described Equation 2.

An exemplary analog-to-digital conversion method will be described with to FIGS. 3 to 5.

An analog-to-digital conversion method includes comparing the magnitudes of the input voltage VIN and the first voltage V1 (hereinafter, referred to as a "comparison step") and analog-to-digital converting the input voltage VIN, having a resolution of N bits. The method further includes generating the digital signal DIG<0:N−1> by analog-to-digital converting (hereinafter referred to as the "conversion step") the input voltage VIN with the resolution of N−M (1≤M<N) bits, and, in the case where the input voltage VIN is smaller than the first voltage V1, generating (hereinafter referred to as the "correcting step) a corrected digital signal DIG_COR<0:N−1> based on a boundary value BND<0:N−1> and the digital signal DIG<0:N−1>. In the case where the input voltage VIN is larger than the first voltage V1, the digital signal DIG<0:N−1> is outputted as the corrected digital signal DIG_COR<0:N−1>. (hereinafter, referred to as a 'conversion step'), and the step of generating the corrected digital signal DIG_COR<0:N−1> in response to the boundary value BND<0:N−1> and the digital signal DIG<0:N−1> in the case where the value of the digital signal DIG<0:N−1> is larger than the boundary value BND<0:N−1> and the input voltage VIN is smaller than the first voltage V1 (hereinafter referred to as a 'correction step'). In the comparison step, the comparing section 321 compares the input voltage VIN and the first voltage outputs a comparison result.

In the conversion step, the input voltage VIN is analog-to-digital converted to the resolution determined based on the result of the comparison step, and the digital signal DIG<0:N−1> is generated. The analog-to-digital conversion unit 310 generates the digital signal DIG<0:N−1>, by analog-to-digital converting the input voltage VIN to the resolution of N bits, in the case where the input voltage VIN is smaller than the first voltage, and generates the digital signal DIG<0:N−1>, by analog-to-digital converting the input voltage VIN with the resolution of N−M bits, in the case where the input voltage VIN is larger than the first voltage.

In the correction step, the corrected digital signal DIG_COR<0:N−1> is generated according to the following Equation 5 (which is the same as the above-described Equation 1) by using the boundary value BND<0:N−1> and the digital signal DIG<0:N−1>.

$$\text{Corrected digital signal}(DIGCOR\langle 0:N-1\rangle) = \text{boundary value}(BND\langle 0:N-1\rangle) + \frac{1}{2^M}(\text{digital signal}(DIG\langle 0:N-1\rangle) - \text{boundary value}(BND\langle 0:N-1\rangle)) \quad \text{[Equation 5]}$$

The exemplary analog-to-digital conversion method has been described with regard to decreasing a resolution as the voltage level of the input voltage VIN increases. Alternatively, the exemplary analog-to-digital conversion method may be applied to a case where a resolution is increased as the voltage level of the input voltage VIN increases, in an analog-to-digital conversion method. In this case, the corrected digital signal DIG_COR<0:N−1> may be generated, in the correction step, according to the above-described Equation 5.

Figure 10:
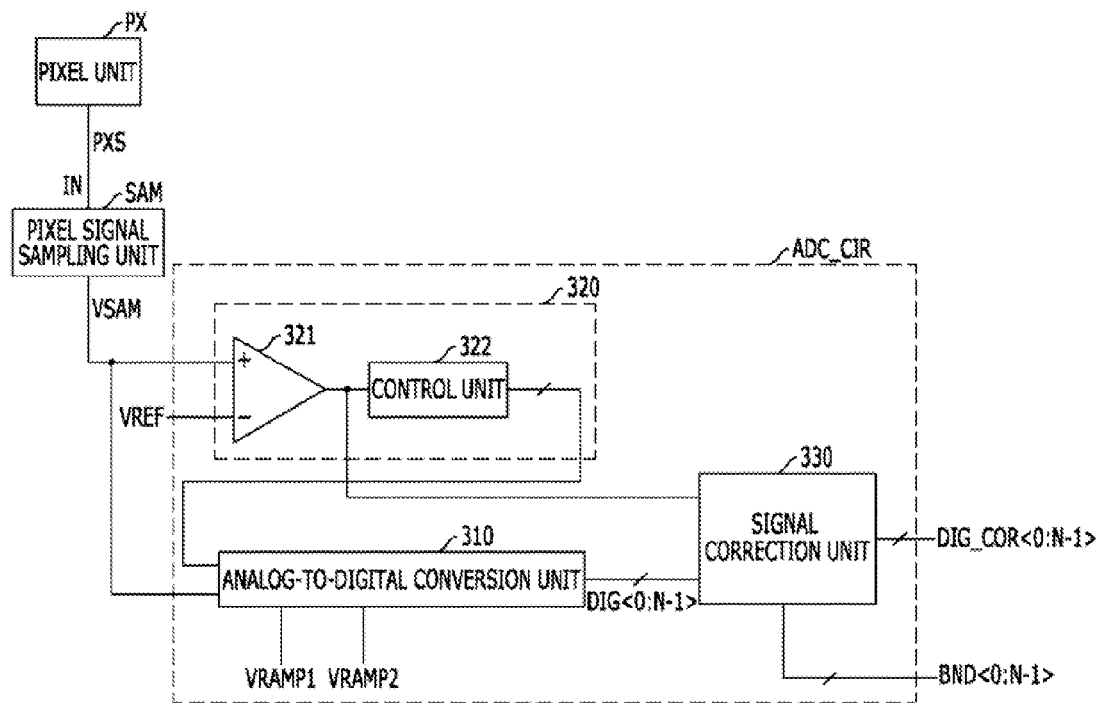
FIG. 10 is a configuration diagram of an image sensor in accordance with another implementation.

FIG. 10 is a configuration diagram of an exemplary image sensor. The image sensor of FIG. 10 includes an analog-to-digital conversion circuit ADC_CIR which is the same as the analog-to-digital conversion circuit shown in FIG. 3.

Referring to FIG. 10, an exemplary image sensor includes a pixel unit PX to output a pixel signal PXS having a level corresponding to a reset voltage VRST or incident light. The exemplary image sensor includes a pixel signal sampling unit SAM to sample the pixel signal PXS, and an analog-to-digital conversion unit 310 to analog-to-digital convert a sampling voltage VSAM sampled by the pixel signal sampling unit SAM and generate a digital signal DIG<0:N−1> The exemplary image sensor further includes a resolution control unit 320 to control the resolution of the analog-to-digital conversion unit 310 to N bits, in the case where the sampling voltage VSAM is smaller than a first voltage, or to control the resolution of the analog-to-digital conversion unit 310 to N−M (1≤M<N) bits, in the case where the sampling voltage VSAM is larger than the first voltage. The exemplary image sensor further includes a signal correction unit 330 to generate a corrected digital signal DIG_COR<0:N−1> based on a boundary value BND<0:N−1> and the digital signal DIG<0:N−1>, in the case where the value of the digital signal DIG<0:N−1> is larger than the boundary value BND<0:N−1> and the sampling voltage VSAM is smaller than the first voltage.

An operation of the image sensor will be described with reference to FIG. 10.

The configuration and operations of the analog-to-digital conversion circuit ADC_CIR included in the image sensor are the same as the configuration and operations of the analog-to-digital conversion circuit described above with reference to FIGS. 3 to 5. Accordingly, descriptions for the configuration and operations of an analog-to-digital convertor will be omitted herein. The sampling voltage VSAM corresponds to the input voltage VIN of FIG. 3.

The pixel signal sampling unit SAM may sample the difference between the pixel signal PXS, which corresponds to the reset voltage VRST, and the pixel signal PXS, which has a level corresponding to the light incident on the pixel unit PX, and output a sampling voltage VSAM. Such a sampling method is referred to as a CDS (correlated-double sampling) scheme. Since sampling using the CDS scheme is generally known to a person skilled in the art, detailed descriptions thereof will be omitted herein.

The analog-to-digital conversion circuit ADC_CIR analog-to-digital converts the sampling voltage VSAM according to the procedure described above with reference to FIGS. 3 to 5, and generates the corrected digital signal DIG_COR<0:N−1> by correcting the sampling voltage VSAM according to the following Equation 6.

$$\text{Corrected digital signal}(DIGCOR\langle 0{:}N-1\rangle) = \\ \text{boundary value}(BND\langle 0{:}N-1\rangle) + \\ \frac{1}{2^M}(\text{digita signal}(DIG\langle 0{:}N-1\rangle) - \\ \text{boundary value}(BND\langle 0{:}N-1\rangle))$$
[Equation 6]

The corrected digital signal DIG_COR<0:N−1> is data (hereinafter, referred to as "image data") corresponding to the light incident on the pixel unit PX.

Is has been described above that the image sensor samples the difference between the pixel signal PXS, which corresponds to the reset voltage VRST, and the pixel signal PXS, which corresponds to the light inputted to the pixel unit PX, and outputs the sampling voltage VSAM, analog-to-digital converts the sampling voltage VSAM, and generates the image data. In an alternative implementation, the image sensor may generate first data by sampling the pixel signal PXS, which corresponds to the reset voltage VRST, and analog-to-digital converting the sampling voltage VSAM, generates second data by sampling the pixel signal PXS corresponding to the light inputted to the pixel unit PX, as the sampling voltage VSAM, and analog-to-digital converting the sampling voltage VSAM, and generates image data by obtaining the difference between the first data and the second data.

Figure 11:
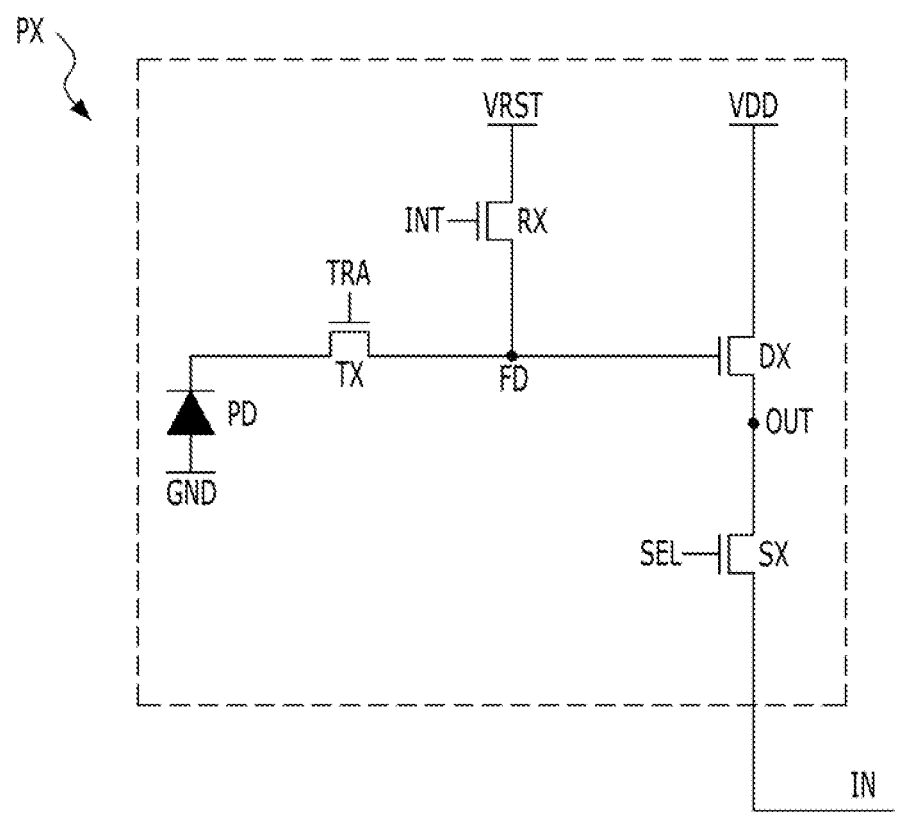
FIG. 11 is a configuration diagram of a pixel unit.

FIG. 11 is a configuration diagram of the pixel unit PX.

Referring to FIG. 11, the pixel unit PX includes a photodiode PD to generate photocharges in response to incident light, a reset transistor RX to drive a floating diffusion node FD with the reset voltage VRST in response to an initialization signal INT, a transmission transistor TX to transmit the photocharges generated by the photodiode PD to the floating diffusion node FD in response to a transmission signal TRA, and a driving transistor DX to pull-up drive an output node OUT in response to the voltage of the floating diffusion node FD. Also, the pixel unit PX further includes a select transistor SX configured to electrically connect the output node OUT and an input node IN of the pixel signal sampling unit SAM in the case where the pixel unit PX corresponding to the select transistor SX is selected.

The pixel unit PX will be described below with reference to FIG. 11.

If the pixel unit PX is selected, a select signal SEL is activated and the select transistor SX is turned on, by which the output node OUT and the input node IN are electrically connected with each other. The reset transistor RX drives the floating diffusion node FD with the reset voltage VRST in response to the initialization signal INT in a first operation of the image sensor. For reference, the reset voltage VRST may be a power supply voltage VDD. The driving transistor DX pull-up drives the output node OUT in response to the voltage of the floating diffusion node FD. Through this procedure, the pixel signal PXS is outputted to the output node OUT. The pixel signal PXS is applied to the input node IN.

The transmission transistor TX transmits the photocharges generated by the photodiode PD to the floating diffusion node FD in response to the transmission signal TRA in a second operation of the image sensor. The driving transistor DX pull-up drives the output node OUT in response to the voltage of the floating diffusion node FD. Through this procedure, the pixel signal PXS is outputted to the output node OUT. The pixel signal PXS is applied to the input node IN. The voltage level of the pixel signal PXS is determined Based on an amount of photocharges generated by the photodiode PD due to the incident light.

The reason why the pixel signal PXS corresponding to the reset voltage VRST and the pixel signal PXS corresponding to the inputted light are sampled together is to remove and offset fixed pattern noise (FPN) associated with inconsistency of a signal processing circuit of the image sensor through CDS (correlated-double sampling).

Although various exemplary implementations have been described for illustrative purposes, it will be apparent to those skilled in the art that various changes and modifications may be made without departing from the spirit and scope of the invention as defined in the following claims.

The invention claimed is:

1. An analog-to-digital conversion circuit comprising:
   an analog-to-digital conversion unit configured to analog-to-digital convert an input voltage and generate a digital signal;
   a resolution control unit configured to:
   set a resolution of the analog-to-digital conversion unit to N(N is the natural number) bits, in a case where the input voltage is smaller than a first voltage, and
   set the resolution of the analog-to-digital conversion unit to N−M (1≤M <N, M is the natural number) bits in a case where the input voltage is larger than the first voltage; and
   a signal correction unit configured to:
   generate a corrected digital signal based on calculation using a boundary value and the digital signal, which include digital values, in a case where a value of the digital signal is larger than the boundary value and the input voltage is smaller than the first voltage.

2. The analog-to-digital conversion circuit according to claim 1, wherein the signal correction unit is to:
   generate the corrected digital signal based on Equation as follows, $$\text{The corrected digital signal} = \\ \text{the boundary value} + \frac{1}{2^M}(\text{the digita signal} - \text{the boundary value})$$

in the case where the value of the digital signal is larger than the boundary value and the input voltage is smaller than the first voltage.

3. The analog-to-digital conversion circuit according to claim 1, wherein the signal correction unit is to:

output the digital signal as the corrected digital signal, in a case where the value of the digital signal is smaller than the boundary value or the input voltage is larger than the first voltage.

4. The analog-to-digital conversion circuit according to claim 1, wherein the digital signal and the corrected digital signal has a resolution of N bits.

5. The analog-to-digital conversion circuit according to claim 1, wherein the analog-to-digital conversion unit is to:
generate, in the case where the resolution is N bits, the digital signal using a first ramp signal, having a first slope, and the input voltage, or
generate, in the case where the resolution is N−M bits, the digital signal using a second ramp signal, having a second slope that is $2^M$ times the first slope, and the input voltage.

6. An analog-to-digital conversion circuit comprising:
an analog-to-digital conversion unit configured to analog-to-digital convert an input voltage and generate a digital signal;
a resolution control unit configured to:
set a resolution of the analog-to-digital conversion unit to N bits, in the case where the input voltage is smaller than a first voltage, and set the resolution of the analog-to-digital conversion unit to N+M bits, in the case where the input voltage is larger than the first voltage; and
a signal correction unit configured to:
generate a corrected digital signal based on calculation using a boundary value and the digital signal, which include digital values, in the case where the input voltage is larger than the first voltage or a value of the digital signal is smaller than the boundary value.

7. The analog-to-digital conversion circuit according to claim 6, wherein the signal correction unit is to:
generate the corrected digital signal based on Equation as follows, The corrected digital signal = the boundary value $- \frac{1}{2^M}$ (the boundary value − the digita signal)

in the case where the input voltage is larger than the first voltage and the value of the digital signal is smaller than the boundary value.

8. The analog-to-digital conversion circuit according to claim 6, wherein the signal correction unit is to:
output the digital signal as the corrected digital signal, in the case where the input voltage is smaller than the first voltage or the value of the digital signal is larger than the boundary value.

9. The analog-to-digital conversion circuit according to claim 6, wherein each of the digital signal and the corrected digital signal has a resolution of N+M bits.

10. The analog-to-digital conversion circuit according to claim 6, wherein the analog-to-digital conversion unit is to:
generate, in the case where the resolution is N bits, the digital signal using a first ramp signal, having a first slope, and the input voltage, or
generate, in the case where the resolution is N+M bits the digital signal using a second ramp signal, having with a second slope that is $½^M$ times the first slope, and the input voltage.

11. An analog-to-digital conversion circuit comprising:
an analog-to-digital conversion unit configured to analog-to-digital convert an input voltage and generate a digital signal;
a resolution control unit configured to:
set a resolution of the analog-to-digital conversion unit to N(N is the natural number) bits, in a case where the input voltage is smaller than a first voltage,
set a resolution of the analog-to-digital conversion unit to N−K1 (1≤K1 <N, K1 is the natural number) bits, in a case where the input voltage is larger than the first voltage and is smaller than a second voltage larger than the first voltage, and
set a resolution of the analog-to-digital conversion unit to N−K1−K2 (1≤K2 <N−K2, K2 is the natural number) bits, in a case where the input voltage is larger than the second voltage; and
a signal correction unit configured to:
generate a corrected digital signal based on calculation using a first boundary value and the digital signal. which include digital values, in the case where a value of the digital signal is larger than the first boundary value and the input voltage is smaller than the first voltage, and
generate a corrected digital signal based on calculation using a second boundary value and the digital signal. which include digital values, in a case where the value of the digital signal is larger than the second boundary value larger than the first boundary value and the input voltage is smaller than the second voltage.

12. The analog-to-digital conversion circuit according to claim 11, wherein the signal correction unit is to:
generate the corrected digital signal based on Equation as follows, The corrected digital signal = the first boundary value +

$\frac{1}{2^{K1}}$ (the digita signal − the first boundary value)

in the case where the value of the digital signal is larger than the first boundary value and the input voltage is smaller than the first voltage, and
generate the corrected digital signal based on Equation as follows, The corrected digital signal = the second boundary value +

$\frac{1}{2^{K2}}$ (the digita signal − the second boundary value)

in the case where the value of the digital signal is larger than the second boundary value and the input voltage is smaller than the second voltage.

13. The analog-to-digital conversion circuit according to claim 11, wherein the signal correction unit is to:
output the digital signal as the corrected digital signal, in the case where the value of the digital signal is smaller than the first boundary value,
output the digital signal as the corrected digital signal, in the case where the input voltage is larger than the first voltage and the value of the digital signal is smaller than the second boundary value, or
output the digital signal as the corrected digital signal, in the case where the input voltage is larger than the second voltage.

14. The analog-to-digital conversion circuit according to claim 11, wherein the analog-to-digital conversion unit is to:
- generate, in the case where the resolution is N bits, the digital signal using a first ramp signal, having a first slope, and the input voltage,
- generate in the case where the resolution is N−K1 bits, the digital signal using a second ramp signal, having a second slope that is $2^{K1}$ times the first slope, and the input voltage, or
- generate the digital signal using a third ramp signal, having a third slope that is to $2^2$ times the second slope, and the input voltage.

15. An analog-to-digital conversion method comprising:
- comparing a voltage level of an input voltage and a voltage level of a first voltage;
- analog-to-digital converting the input voltage using a resolution of N(N is the natural number) bits and generating a digital signal, in the case where the input voltage is smaller than the first voltage, or
- analog-to-digital converting the input voltage, using a resolution of N−M ($1 \leq M < N$, M is the natural number) bits and generating a digital signal, in the case where the input voltage is larger than the first voltage; and
- generating a corrected digital signal based on calculation using a boundary value and the digital signal, which include digital values, in the case where a value of the digital signal is larger than the boundary value and the input voltage is smaller than the first voltage.

16. The analog-to-digital conversion method according to claim 15, wherein the generating a corrected digital signal further comprises:
- generating the corrected digital signal based on Equation as follows, The corrected digital signal =

$$\text{the boundary value} + \frac{1}{2^M} (\text{the digita signal} - \text{the boundary value})$$

in the case where the value of the digital signal is larger than the boundary value and the input voltage is smaller than the first voltage.

17. The analog-to-digital conversion method according to claim 15, wherein the generating a corrected digital signal further comprises:
- output digital signal as the corrected digital signal, in the case where the value of the digital signal is smaller than the boundary value or the input voltage is larger than the first voltage.

18. The analog-to-digital conversion method according to claim 15, wherein the generating a digital signal further comprises:
- generating, in the case where the resolution is N bits, a digital signal using a first ramp signal, having a first slope, and the input voltage, or
- generating, in the case where the resolution is N−M bits, a digital signal using a second ramp signal, having a second slope that is $2^m$ times the first slope, and the input voltage.

19. An image sensor comprising:
- a pixel unit configured to output a pixel signal having a voltage level;
- a pixel signal sampling unit configured to sample the pixel signal and output a sampling voltage;
- an analog-to-digital conversion unit configured to:
- receive the sampling voltage,
- analog-to-digital convert the sampling voltage, and
- generate a digital signal based on the sampling voltage;
- a resolution control unit configured to:
- set a resolution of the analog-to-digital conversion unit to N bits, in the case where the sampling voltage is smaller than a first voltage, or
- set a resolution of the analog-to-digital conversion unit to N-M ($1 < M < N$) bits, in the case where the sampling voltage is larger than the first voltage; and
- a signal correction unit configured to generate a corrected digital signal based on calculation using a boundary value and the digital signal, which include digital values, in the case where a value of the digital signal is larger than the boundary value and the sampling voltage is smaller than the first voltage.

20. The image sensor according to claim 19, wherein the signal correction unit is to:
- generates the corrected digital signal based on Equation as follows.

The corrected digital signal =

$$\text{the boundary value} + \frac{1}{2^M} (\text{the digita signal} - \text{the boundary value})$$

in the case where the value of the digital signal is larger than the boundary value and the sampling voltage is smaller than the first voltage.

21. The image sensor according to claim 19, wherein the signal correction unit is to:
- output the digital signal as the corrected digital signal in a case where the value of the digital signal is smaller than the boundary value and the sampling voltage is larger than the first voltage.

* * * * *